United States Patent
Yee

(10) Patent No.: US 7,053,488 B2
(45) Date of Patent: May 30, 2006

(54) MICRO-MIRROR PACKAGE

(75) Inventor: Kuo-Chung Yee, Taipei (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 10/905,400

(22) Filed: Dec. 31, 2004

(65) Prior Publication Data

US 2005/0164426 A1 Jul. 28, 2005

(30) Foreign Application Priority Data

Dec. 31, 2003 (TW) ............................. 92137704 A

(51) Int. Cl.
*H01L 29/40* (2006.01)

(52) U.S. Cl. .................. 257/778; 438/106; 257/788; 257/784; 257/783; 257/678

(58) Field of Classification Search ................ 257/778
See application file for complete search history.

(56) References Cited

U.S. PATENT DOCUMENTS

| 6,415,505 B1 | 7/2002 | Glenn ........................ 29/852 |
| 6,950,224 B1 * | 9/2005 | Chen et al. ................. 359/291 |
| 2005/0017334 A1 * | 1/2005 | Tao ............................ 257/678 |

* cited by examiner

*Primary Examiner*—Thao P. Le
(74) *Attorney, Agent, or Firm*—Jianq Chyun IP Office

(57) ABSTRACT

A micro-mirror package comprising a substrate, a bottom substrate, a cover substrate, a semiconductor chip, a first adhesive, a second adhesive, a plurality of wires and a lid is provided. The substrate has a circular wall. The bottom substrate is disposed on the substrate within the circular wall. The first adhesive is provided with first spacers for attaching the cover substrate to the semiconductor chip and setting the cover substrate and the semiconductor chip apart. The second adhesive is provided with second spacers for attaching the semiconductor chip to the bottom substrate and setting the semiconductor chip and the bottom substrate apart. The wires are used for electrically connecting the semiconductor chip and the substrate. The lid is disposed on top of the circular wall.

14 Claims, 2 Drawing Sheets

MICRO-MIRROR PACKAGE

CROSS-REFERENCE TO RELATED APPLICATION

This application claims the priority benefit of Taiwan application serial no. 92137704, filed on Dec. 31, 2003.

BACKGROUND OF THE INVENTION

1. Field of the Invention

The present invention relates to a semiconductor package and manufacturing method thereof. More particularly, the present invention relates to a micro-machine package having a sealed hollow chamber.

2. Description of the Related Art

Micro-machines such as micro-machine sensing elements and micro-mirrors have been widely researched in the recent years. These micro-machines have miniaturized movable or oscillatory structures including cantilever, capacitor devices, yokes and hinges. In general, semiconductor devices such as a complementary metal-oxide-semiconductor (CMOS) may serve as control elements to trigger the movement of the oscillatory structure inside the micro-machines. Since the action produced by the micro-machine depends on the movement of the miniaturized oscillatory structure, it is critical that the package enclosing the micro-machine should not touch any part of the miniaturized oscillatory structure under all circumstances.

A number of package structures for micro-machines has been disclosed, for example, disclosed in U.S. Pat. No. 6,415,505 which is incorporated herein for reference. FIG. 1 is a schematic cross-sectional view of a conventional micro-mirror package. As shown in FIG. 1, the micro-mirror package 10 comprises a micro-mirror chip 14 having an oscillatory structure 15 and a semiconductor chip such as a complementary metal-oxide-semiconductor (CMOS) chip 12. The micro-mirror package 10 also comprises an actuator device or electrode 13 that can correspond with the oscillatory structure 15. The micro-mirror chip 14 is disposed above the CMOS chip 12 but uniformly set apart from the CMOS chip 12 by spacers 16 to form a sealed hollow chamber 30. Thus, the oscillatory structure 15 is free to move within the hollow chamber 30 and coordinates with the electrode 13. The CMOS chip 12 is fixed to a ceramic substrate 20 through an adhesive layer 32. Through a plurality of bonding wires 36, the CMOS chip 12 is electrically connected to the ceramic substrate 20. The ceramic substrate 20 has a circular wall 22 surrounding the CMOS chip 12. A transparent lid 26 is fastened to the top of the circular wall 22 through a sealing element 24. Furthermore, the micro-mirror chip 14 may connect with the substrate 20 through a ground wire 34.

In the aforementioned structure, the CMOS chip 12 is fabricated using silicon and the micro-mirror chip 14 is fabricated using transparent glass such as the brand name Eagle 200 brand of Corning Inc. In general, the coefficient of thermal expansion (CTE) of the glass is very close to the CTE of silicon, about 4 ppm/° C., so that the thermal mismatch is minimized. However, the CTE of the substrate 20 is about 12~14 ppm/° C. and a significant difference in CTE exists between the substrate 20 and the CMOS chip 12. If the micro-mirror package 10 encounters any temperature changes or cycles during the fabrication process or during normal operation, the CMOS chip 12 will be subjected to the thermal stress, which can easily lead to warpage or fatigue failure. In particular, if the micro-mirror package 10 is an optical device installed within a projector, minute deformation in the CMOS chip may lead to a substantial drop in image quality. Hence, it is essential to provide a semiconductor micro-machine package structure capable of minimizing heat-related deformation.

SUMMARY OF THE INVENTION

Accordingly, at least one objective of the present invention is to provide a micro-machine semiconductor package structure having less thermal deformity.

To achieve these and other advantages and in accordance with the purpose of the invention, as embodied and broadly described herein, the invention provides a micro-mirror package structure. The micro-mirror package comprises a substrate, a bottom substrate, a cover substrate, a semiconductor chip, a first adhesive, a second adhesive, a plurality of wires and a lid. The substrate has a circular wall. The bottom substrate is disposed on the substrate and within the circular wall. The first adhesive is provided with first spacers and disposed between the cover substrate and the semiconductor chip to set the cover substrate and the semiconductor chip apart and attach the cover substrate with the semiconductor chip. The second adhesive is provided with second spacers and disposed between the semiconductor chip and the bottom substrate to attach the semiconductor chip to the bottom substrate and set them apart. The wires are used for electrically connecting the semiconductor chip with the substrate. The lid is disposed on the circular wall.

Accordingly, the micro-mirror semiconductor package of the present invention has a bottom substrate and a CMOS chip sandwiched between the micro-mirror chip and the bottom substrate. Since the CMOS chip is constrained by the micro-mirror chip and the bottom substrate, the degree of warping in the CMOS chip is minimized.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
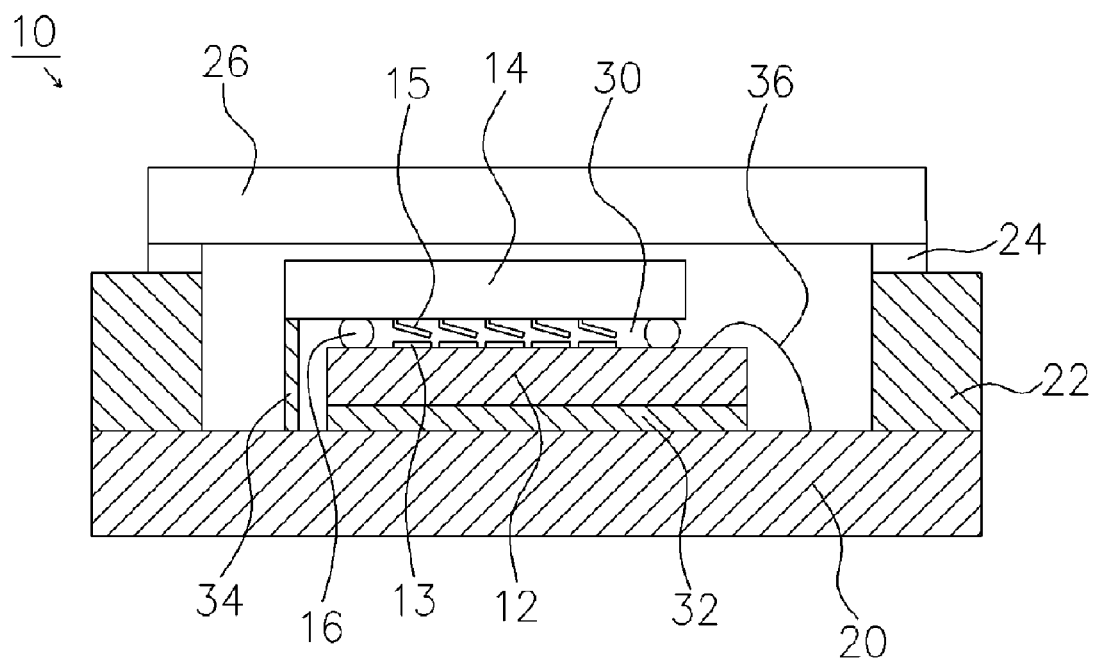
FIG. 1 is a schematic cross-sectional view of a conventional micro-mirror package.

Reference will now be made in detail to the present preferred embodiments of the invention, examples of which are illustrated in the accompanying drawings. Wherever possible, the same reference numbers are used in the drawings and the description to refer to the same or like parts.

Figure 2:
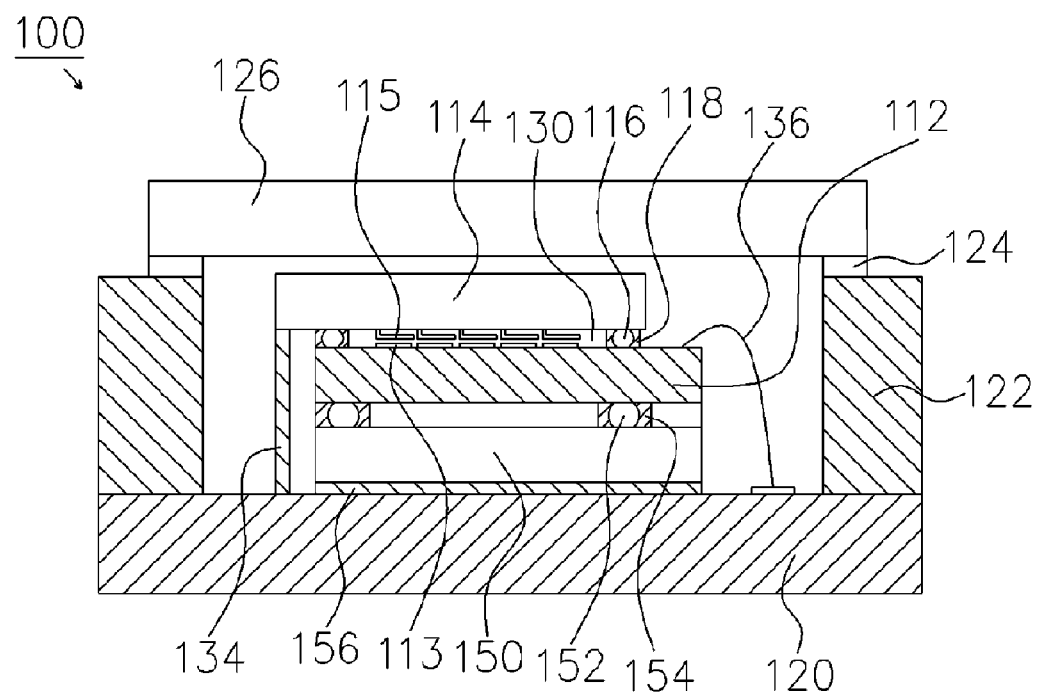
FIG. 2 is a schematic cross-sectional view of a micro-mirror package according to one preferred embodiment of the present invention.

FIG. 2 is a schematic cross-sectional view of a micro-mirror package according to one preferred embodiment of the present invention. As shown in FIG. 2, the micro-mirror package 100 comprises a micro-mirror chip 114 such as a glass substrate having a oscillatory micro-mirror structure 115 thereon, and a semiconductor chip 112 such as a complementary metal-oxide-semiconductor (CMOS) chip having an actuator device or electrode 113 corresponding to the oscillatory micro-mirror structure 115. First spacers 116 combined with an adhesive material (or adhesive) 118 are disposed between the micro-mirror chip 114 and the CMOS chip 112 for joining the micro-mirror chip 114 and the CMOS chip 112 together and setting them uniformly apart to form a hollow chamber 130. Preferably, the hollow chamber 130 is a sealed chamber. With this disposition, the oscillatory micro-mirror structure 115 interacts with the electrode 113 and is free to move inside the hollow chamber 130. The movement of the oscillatory micro-mirror structure 115 is influenced by the electrode 113.

Second spacers 152 combined with another adhesive material 154 are disposed between the CMOS chip 112 and a bottom substrate 150 for attaching the CMOS chip 112 to the bottom substrate 150 and setting them uniformly apart. The bottom substrate 150 is attached to a substrate 120 such as a ceramic substrate through another adhesive material 156. The CMOS chip 112 is electrically connected to the ceramic substrate 120 through a plurality of wires 136. The ceramic substrate 120 has a circular wall 122 surrounding the CMOS chip 112, the micro-mirror chip 114 and the bottom substrate 150. Furthermore, a transparent lid 126 is fastened to the top of the circular wall 122 through a sealed element 124. In fact, the transparent lid 126 can be a lens capable of focusing light onto the micro-mirror chip 114. The micro-mirror chip 114 can connect with the substrate 120 through a grounding wire (or line) 134. In addition, a plurality of solder balls (not shown) for electrically connecting with an external printed circuit board can also be arranged on the ceramic substrate 120.

The CMOS chip 112 can be fabricated using silicon. The micro-mirror chip 114 and the bottom substrate 150 can be fabricated using the same material. With the CMOS chip 112 sandwiched between the micro-mirror chip 114 and the bottom substrate 150, any warpage occurred in the CMOS chip 112 is lowered due to confinement by the micro-mirror chip 114 and the bottom substrate 150.

According to one embodiment of the present invention, the micro-mirror chip 114 and the bottom substrate 150 can be fabricated using a transparent material such as, a glass in the brand name Eagle 200 glass purchased from Corning Inc., which has a coefficient of thermal expansion (CTE) around 4 ppm/° C. comparable to silicon. The first and the second spacers 116 and 152 can be fabricated by using borosilicate glasses. The height of the hollow chamber 130 depends on the size of the first spacers 116. In general, the spacers 116 have an average diameter of around 200 μm. On the other hand, the size of the second spacers 152 can be varied for producing different bond line thickness, so that an optimal heat dissipation efficiency for the micro-mirror package 100 is established.

Furthermore, the adhesive materials (adhesives) 118, 154 and 156 can be low-strength epoxy materials capable of buffering possible thermal mismatch between the chips and substrates inside the micro-mirror package 100, so that warpage is minimized. In addition, the epoxy materials of the adhesives 118, 154 and 156 can be low out gassing materials for avoiding the production of sub-micron particles.

Figure 3:
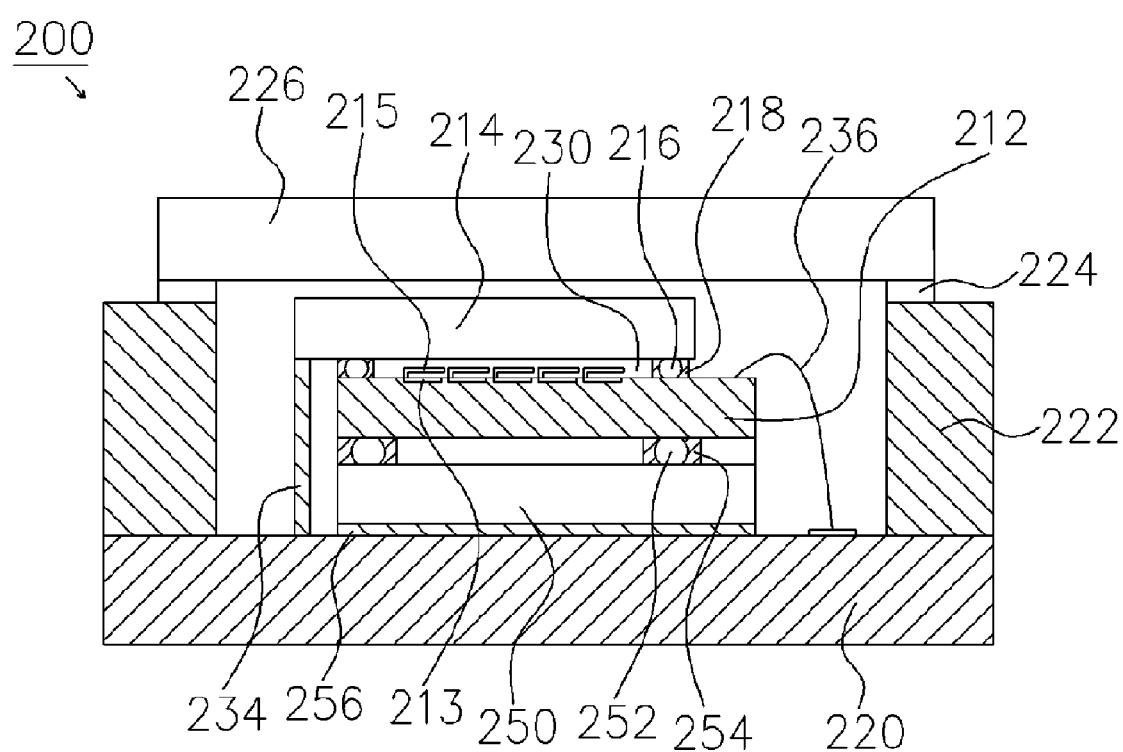
FIG. 3 is a schematic cross-sectional view of a micro-mirror package according to another preferred embodiment of the present invention.

FIG. 3 is a schematic cross-sectional view of a micro-mirror package according to another preferred embodiment of the present invention. As shown in FIG. 3, the micro-mirror package 200 is similar to the package 100 in FIG. 2. Hence, the components equivalent to the ones in FIG. 2 will not be described in details. The micro-mirror package 200 comprises a semiconductor chip 212 and a cover substrate 214. The semiconductor chip 212 has an oscillatory micro-chip structure 215 and an electrode 213 that interacts with the oscillatory microchip structure 215. The cover substrate 214 can be, for example, a transparent substrate or a glass substrate disposed on the semiconductor chip 212 through an adhesive 218 jointed with first spacers 216 to form a hollow chamber 230. Preferably, the hollow chamber 230 is a sealed chamber. With this disposition, the oscillatory microchip structure 215 interacts with the electrode 213 and is free to move inside the hollow chamber 230. Within the micro-mirror package 200, a grounding wire or line 234 is disposed between the cover substrate 214 and the substrate 220.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A micro-mirror package structure, comprising:
   a substrate having a circular wall;
   a bottom substrate disposed on the substrate and within the circular wall;
   a cover substrate;
   a semiconductor chip;
   a first adhesive having first spacers embedded therein, wherein the first adhesive and the first spacers are disposed between the cover substrate and the semiconductor chip for attaching the cover substrate to the semiconductor chip and setting the cover substrate and the semiconductor chip apart;
   a second adhesive having second spacers embedded therein, wherein the second adhesive and the second spacers are disposed between the semiconductor chip and the bottom substrate for attaching the semiconductor chip to the bottom substrate and setting the semiconductor chip and the bottom substrate apart;

a plurality of wires for electrically connecting the semiconductor chip with the substrate; and a lid disposed on a top of the circular wall.

2. The package structure of claim 1, wherein the cover substrate comprises a micro-mirror chip having an oscillatory micro-mirror structure.

3. The package structure of claim 1, wherein the semiconductor chip is a complementary metal-oxide-semiconductor chip.

4. The package structure of claim 1, wherein the semiconductor chip comprises an oscillatory micro-mirror structure and an electrode, and the oscillatory micro-mirror structure interacts with the electrode.

5. The package structure of claim 4, wherein the cover substrate comprises a transparent substrate.

6. The package structure of claim 2, wherein the semiconductor chip has an electrode that interacts with the oscillatory micro-mirror structure.

7. The package structure of claim 1, wherein a size of the second spacers is about 200 μm.

8. The package structure of claim 1, wherein the bottom substrate and the cover substrate are fabricated using a same material.

9. The package structure of claim 1, wherein the bottom substrate and the cover substrate are fabricated by using a glass.

10. The package structure of claim 1, wherein the bottom substrate and the cover substrate are fabricated using a material having a coefficient of thermal expansion (CTE) of about 4 ppm/° C.

11. The package structure of claim 1, wherein the lid is fabricated using a transparent material.

12. The package structure of claim 1, wherein the cover substrate and the semiconductor chip are joined together to form a sealed chamber.

13. The package structure of claim 1, further comprising a grounding line disposed between the cover substrate and the substrate.

14. The package structure of claim 2, further comprising a grounding line disposed between the micro-mirror chip and the substrate.

* * * * *